(12) United States Patent
Kakita et al.

(10) Patent No.: US 7,331,103 B2
(45) Date of Patent: Feb. 19, 2008

(54) MAGAZINE, TRAY COMPONENT FEEDING DEVICE, AND COMPONENT MOUNTING DEVICE

(75) Inventors: Nobuyuki Kakita, Kofu (JP); Kazunori Kanai, Kofu (JP); Osamu Okuda, Yamanashi (JP); Akira Kabeshita, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 465 days.

(21) Appl. No.: 10/416,961

(22) PCT Filed: Dec. 11, 2001

(86) PCT No.: PCT/JP01/10825

§ 371 (c)(1),
(2), (4) Date: May 16, 2003

(87) PCT Pub. No.: WO02/49409

PCT Pub. Date: Jun. 20, 2002

(65) Prior Publication Data

US 2004/0031768 A1 Feb. 19, 2004

(30) Foreign Application Priority Data

Dec. 12, 2000 (JP) ............................. 2000-376980

(51) Int. Cl.
*B23P 19/00* (2006.01)
(52) U.S. Cl. ........................... 29/740; 29/739; 29/832; 29/426.3

(58) Field of Classification Search ................. 29/739, 29/740, 832, 426.3; 369/30.55
See application file for complete search history.

(56) References Cited

U.S. PATENT DOCUMENTS 5,282,183 A * 1/1994 Arifuku et al. .......... 369/30.55

FOREIGN PATENT DOCUMENTS

| EP | 0 400 645 | 12/1990 |
|---|---|---|
| GB | 2 041 726 | 9/1980 |
| JP | 61-060527 | 3/1986 |
| JP | 05-235587 | 9/1993 |
| JP | 08-292696 | 11/1996 |
| JP | 11-176122 | 7/1999 |
| JP | 11-346093 | 12/1999 |

* cited by examiner

*Primary Examiner*—Rick K Chang
(74) *Attorney, Agent, or Firm*—Wenderoth, Lind & Ponack, L.L.P.

(57) ABSTRACT

A magazine is provided with two opening portions that enable insertion and extraction of a tray and are approximately orthogonal to each other, and a regulation portion for regulating insertion and extraction of the tray from the opening portions. A tray component feeding device has a loading port for loading the magazine thereinto, and an extraction port for extracting a tray plate of the magazine, which are approximately orthogonal to each other. Further, a component mounting device is provided with the tray component feeding device loaded with the magazine on a lateral side of the component mounting device to which a transfer conveyor for transferring a circuit board extends.

24 Claims, 17 Drawing Sheets

MAGAZINE, TRAY COMPONENT FEEDING DEVICE, AND COMPONENT MOUNTING DEVICE

TECHNICAL FIELD

The present invention relates to a magazine for housing a plurality of trays that accommodate components such as electronic components or optical components, to a tray component feeding device for loading and feeding the magazine, and to a component mounting device for mounting components on a circuit board with use of the tray component feeding device.

BACKGROUND ART

In recent years, diversification of electronic components is increasing forms of housing components (hereinafter referred to as tray components) in a tray. Also, kinds of components to be mounted on a circuit board are increasing. In such circumstance, a component mounting device for mounting components onto a circuit board is required to install a larger number of component feeding devices including tray component feeding devices for feeding the tray components in a limited installation place.

As prior art examples, a tray component feeding device 102 loaded with a magazine 101 shown in FIGS. 12 and 13 is illustrated in FIG. 14, and the tray component feeding device 102 disposed on a rear side of a component mounting device 103 is shown in FIG. 15.

In these figures, a tray plate 105 loaded with components is inserted along a groove 109 provided on each of left and right lateral sides of the magazine 101. The tray plate 105 is regulated in an arrow p direction by a regulation piece 110 provided in the magazine 101, and also regulated in an arrow q direction by a regulation bar 111. On the tray plate 105, there is placed a tray 104 loaded with components. An elevation device 106 of the tray component feeding device 102 moves the magazine 101 in a vertical direction to a level position at which an arbitrary tray plate 105 is extracted, and an extraction device 107 extracts the tray plate 105 in an arrow P direction, for feeding components to the component mounting device 103.

The elevation device 106 moves the magazine 101 in the vertical direction to a removable level, where an opening and closing door 108 provided in the tray component feeding device 102 is opened, so that the magazine 101 or the tray plate 105 put on the elevation device 106 is removed in an arrow Q direction.

As other prior art, an invention disclosed in Japanese Unexamined Patent Publication No. 8-292696 is shown in FIG. 17, and an invention disclosed in Japanese Unexamined Patent Publication No. 5-235587 is shown in FIG. 18.

However, in the above-stated structure, an insertion port and an extraction port for inserting and extracting tray plates into/from the magazine are disposed at positions opposing to each other. Because of this reason, a tray component feeding device incorporating this magazine is disposed on a rear side of a component mounting device (103 as shown in FIG. 15). Consequently, the tray component feeding device 102 is disposed, for example, in place of a tape-type feeding portion 114, which decreases a number of other tape-type feeding portions, thereby preventing increase in number and kinds of available components.

In addition, disposing the tray component feeding device on the rear side of the component mounting device 103 increases a depth dimension of the component mounting device 103. Because of this reason, in structuring a component mounting line including a component mounting device, an installation pitch L between the line and an adjacent component mounting line should be made larger as shown in FIG. 16. If the mounting line is disposed in a horizontal direction of the component mounting device 103, a distance between the component mounting device 103 and an upstream device or a downstream device should be larger for allowing insertion and extraction of a magazine. A distance required in the above case is not generally compensated by a length of a middle conveyor 112 installed for such purpose as maintenance of the component mounting device 103, which as a result makes the mounting line longer.

In both the examples shown in FIGS. 17 and 18 as other prior art, a tray component feeding device 200 is disposed on a lateral side of a component mounting device 201, and insertion and extraction of the trays are performed from a rear side of the component mounting device 201, for implementing a slight decrease in a depth dimension of the component mounting device 201. In both cases, a direction 210 of extracting a tray plate from a magazine 202 housed in the tray component feeding device 200 is orthogonal to a board transfer direction 211 of a circuit board transferring conveyor 203. This makes a depth dimension of the component mounting device 201 longer for a space necessary to extract a tray plate. Therefore, this prior art has had an issue of decreased area productivity as component mounting devices.

SUMMARY OF THE INVENTION

An object of the present invention is to provide a magazine which enables installation of a component mounting device provided with a tray component feeding device having best area productivity, with the tray component feeding device being loaded with the magazine, as well as the component mounting device, for solving the above-mentioned issues.

In accomplishing these and other aspects, according to a first aspect of the present invention, there is provided a case-type magazine for housing a tray plate, comprising:

a frame having two opening portions disposed on a lateral side thereof, with directions of respectively passing the tray plate through the two opening portions being approximately orthogonal to each other, and with the tray plate being inserted or extracted into/from the two opening portions; and a tray plate regulation member, disposed on the frame, for regulating movement of the tray plate for inserting or extracting the tray plate into/from the two opening portions. This implements a function of making a direction of inserting the tray plate into the magazine approximately orthogonal to a direction of extracting the tray from the magazine.

According to a second aspect of the present invention, there is provided a magazine as defined in the first aspect, further comprising a rack, attached to the frame, for placement of the tray plate. This implements a function of easily loading the tray plate into the magazine.

According to a third aspect of the present invention, there is provided a magazine as defined in the second aspect, wherein the rack is composed of a plurality of partition plates removable from the frame. This implements a function of easily obtaining an arbitrary level rack.

According to a fourth aspect of the present invention, there is provided a magazine as defined in any one of the first to third aspects, wherein supply of components on a tray on the tray plate is performed through one of the two opening portions, and wherein the tray plate regulation member comprises a regulation door that is disposed on the frame so as to correspond to one of the two opening portions and enables opening for extracting or inserting the tray plate from or into the frame in supply of components and closing for regulation of movement of the tray plate. This implements a function of regulating improper movement and achieving proper movement of the tray plate by the opening and closing the regulation door.

According to a fifth aspect of the present invention, there is provided a magazine as defined in any one of the first to third aspects, wherein loading of the tray plate into the magazine is performed through the other of the two opening portions, and wherein the tray plate regulation member comprises a regulation door that is disposed on the frame so as to correspond to the other of the two opening portions, and enables opening for extracting or inserting the tray plate from or into the frame in loading of the tray plate and closing for regulation of movement of the tray plate. This implements a function of regulating improper movement and achieving proper movement of the tray plate by opening and closing the regulation door.

According to a sixth aspect of the present invention, there is provided a magazine as defined in any one of the first to third aspects, wherein supply of components on a tray on the tray plate is performed through one of the two opening portions, and loading of the tray plate into the magazine is performed through the other of the two opening portions, and wherein the tray plate regulation member comprises:

a first regulation door that is disposed on the frame so as to correspond to the one of the two opening portions and enables opening, for extracting or inserting the tray plate from or into the frame in supply of components, and closing for regulation of movement of the tray plate; and a second regulation door that is disposed on the frame so as to correspond to the other of the two opening portions and enables opening, for extracting or inserting the tray plate from or into the frame in loading of the tray plate, and closing for regulation of movement of the tray plate. This implements a function of regulating improper movement and achieving proper movement of the tray plate by opening and closing the regulation doors.

According to a seventh aspect of the present invention, there is provided a magazine as defined in the first to third aspects, wherein the frame comprises a pillar having grooves at constant intervals on a lateral side thereof which is disposed in a line of intersection of the two opening portions, and a side plate having grooves at constant intervals as with the pillar, with the magazine further comprising a rack set in the grooves of the pillar and the side plate. This implements a function of holding the rack with the pillar and the side plate in the magazine.

According to an eighth aspect of the present invention, there is provided a tray component feeding device for loading the magazine defined in any one of the first to third aspects, with the tray component feeding device comprising:

an elevation device for moving a tray plate, put in the magazine set thereto through a loading port, to a tray plate extraction level in an up-and-down direction;

a release device for releasing regulation of the tray plate regulation member that regulates movement of the tray plate into the magazine; and a tray plate extraction device for extracting through a tray plate extraction port the tray plate, moved to the extraction level by the elevation device, when the regulation of the tray plate regulation member is released by the release device, wherein a direction of passing the tray plate through the loading port and a direction of passing the tray plate through the extraction port are approximately orthogonal to each other, and the loading port and the extraction port are respectively disposed in directions approximately identical to the two opening portions of the magazine. This implements a function of making a direction of loading the tray plate and the magazine in the tray component feeding device approximately orthogonal to a direction of extracting the tray from the magazine.

According to a ninth aspect of the present invention, there is provided a component mounting device comprising:

a transfer conveyor for transferring a board;

the tray component feeding device as defined in the eighth aspect which is disposed on a lateral side of the component mounting device in a board transfer direction of the transfer conveyor; and a head unit for picking up a component from the tray component feeding device and mounting this picked-up component onto a board transferred by the transfer conveyor, wherein the direction of passing the tray plate through the extraction port of the tray component feeding device is disposed approximately parallel to a board transfer direction of the transfer conveyor and toward the component mounting device, and the direction of passing the tray plate through the loading port of the tray component feeding device is disposed approximately orthogonal to the board transfer direction of the transfer conveyor and in a direction opposite to the transfer conveyor. This implements a function of decreasing a depth dimension of the tray component feeding device.

BRIEF DESCRIPTION OF DRAWINGS

These and other aspects and features of the present invention will become clear from the following description taken in conjunction with preferred embodiments thereof with reference to the accompanying drawings, in which.

DETAILED DESCRIPTION OF THE PREFERRED EMBODIMENTS

Figure 1:
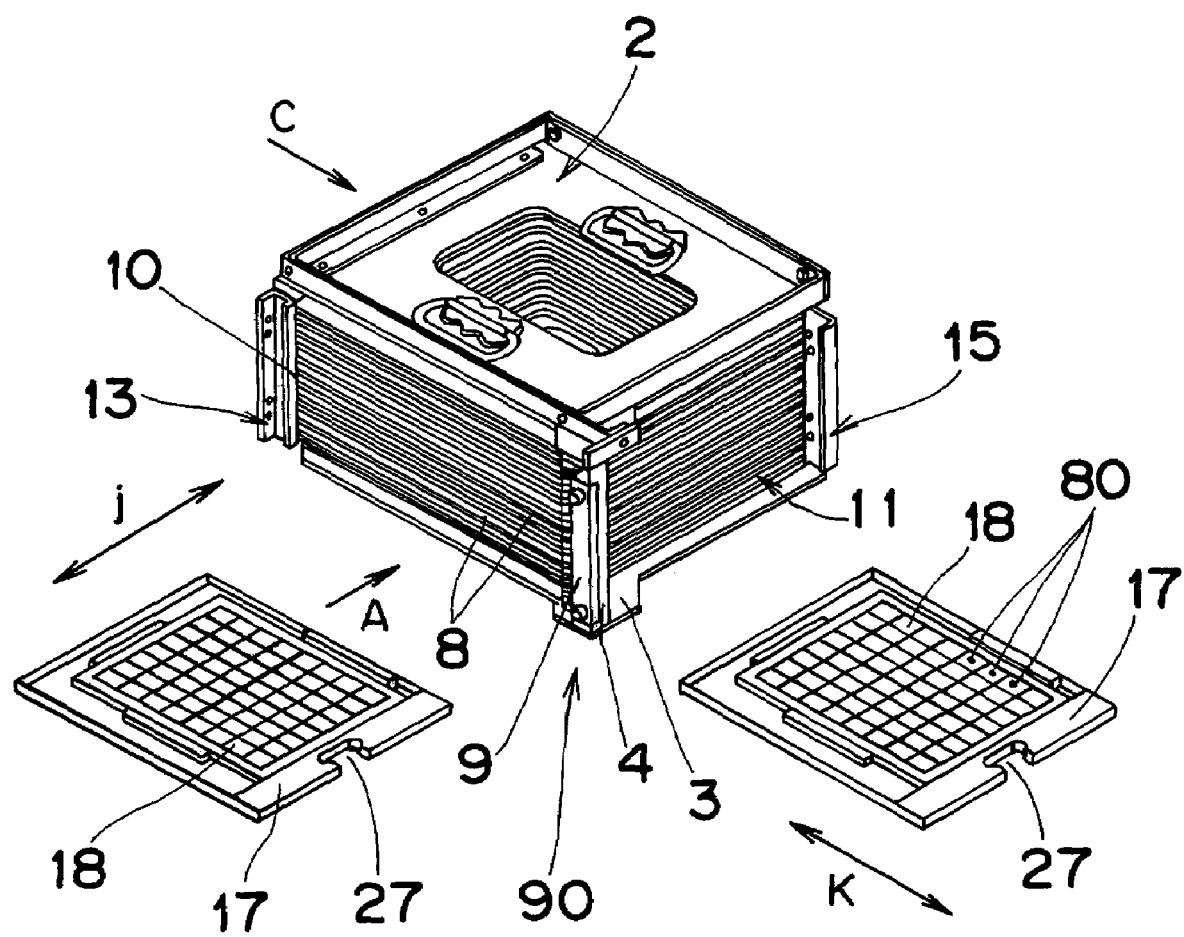
FIG. 1 is a perspective view showing a magazine according to a first embodiment of the present invention.

Before description of the present invention proceeds, it is to be noted that like parts are designated by like reference numerals throughout the accompanying drawings.

Hereinbelow, embodiments of the present invention will be described with reference to FIGS. 1 to 12.

Figure 2:
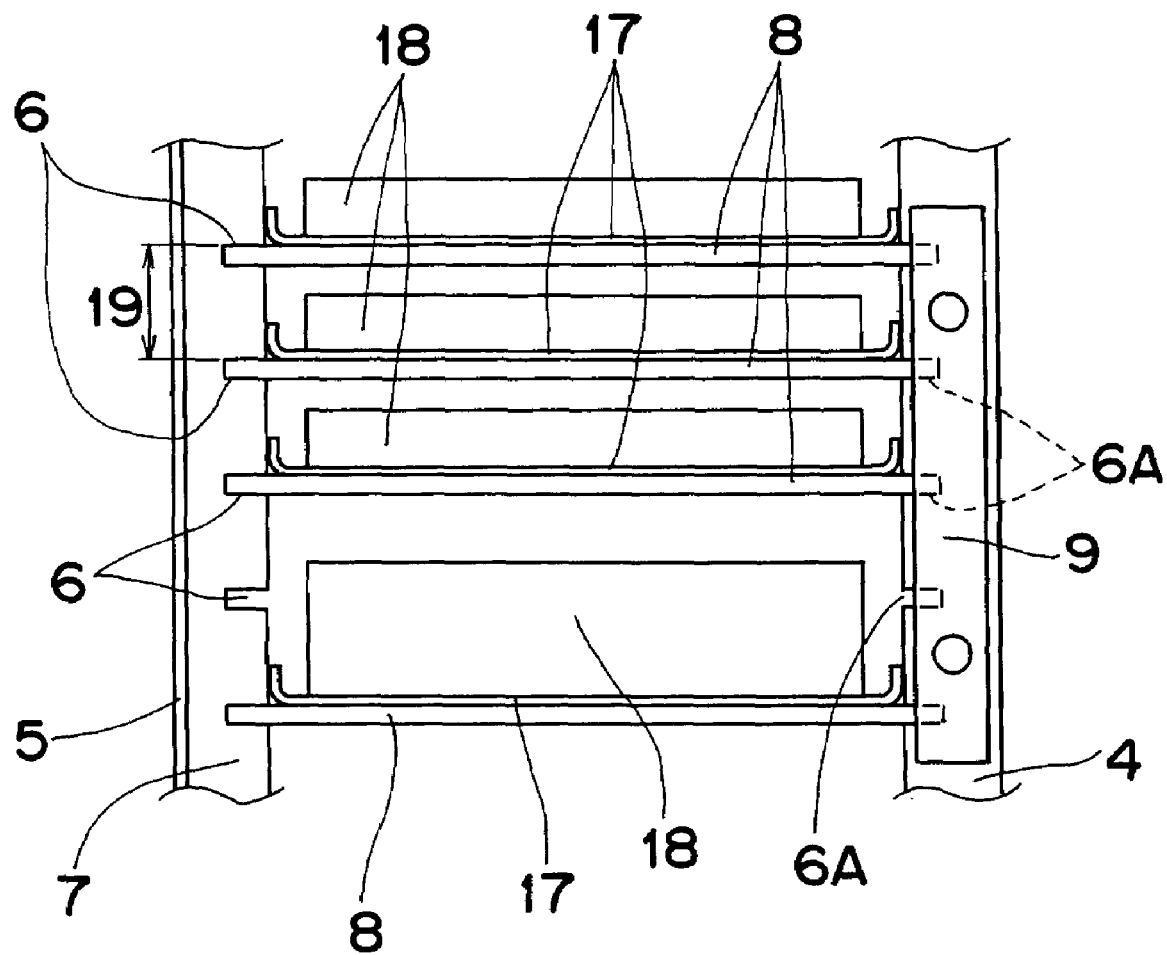
FIG. 2 is a view of FIG. 1 seen from an arrow A direction.
Figure 3:
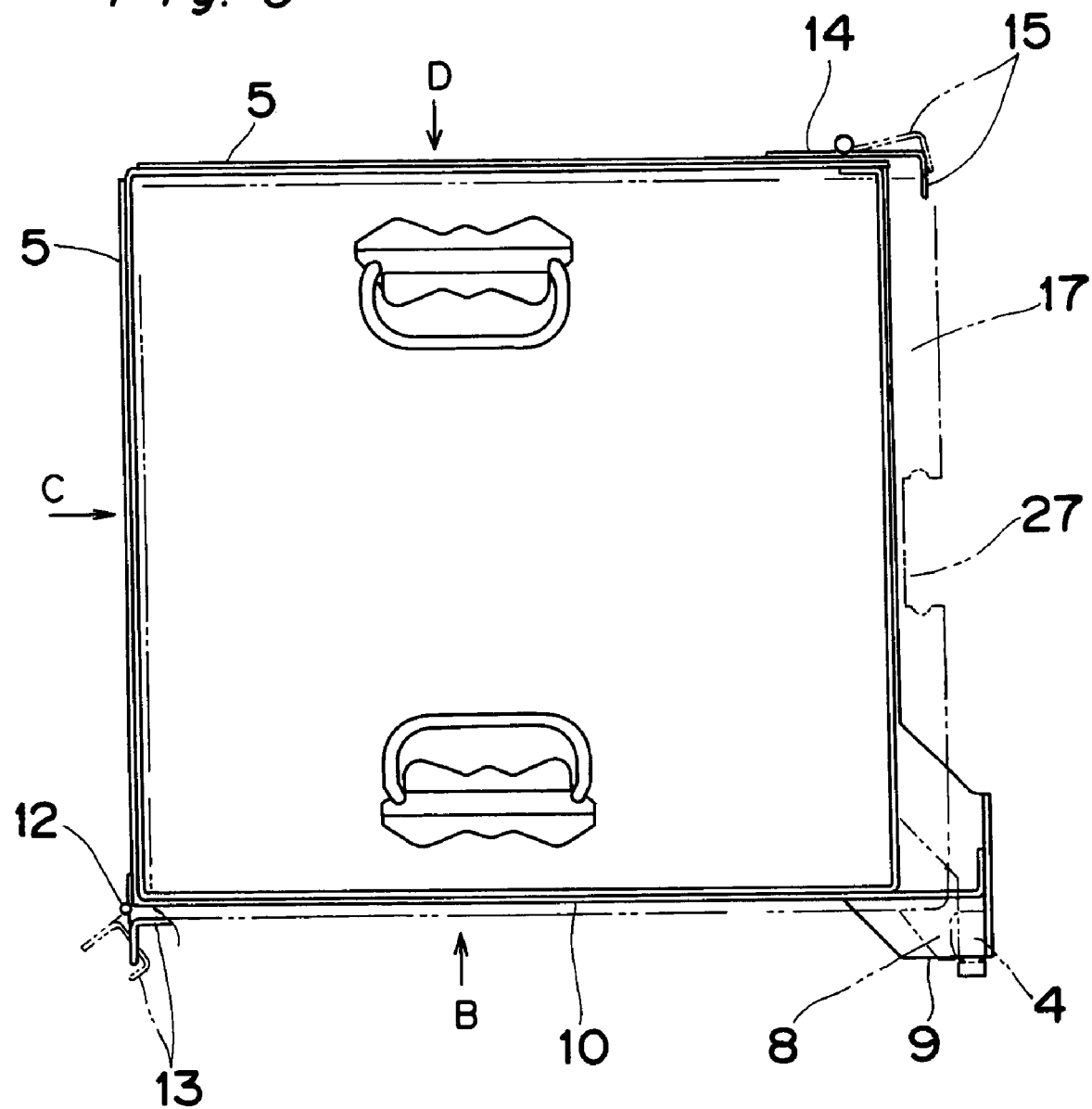
FIG. 3 is a plan view of FIG. 1 seen from a top of the magazine.
Figure 4:
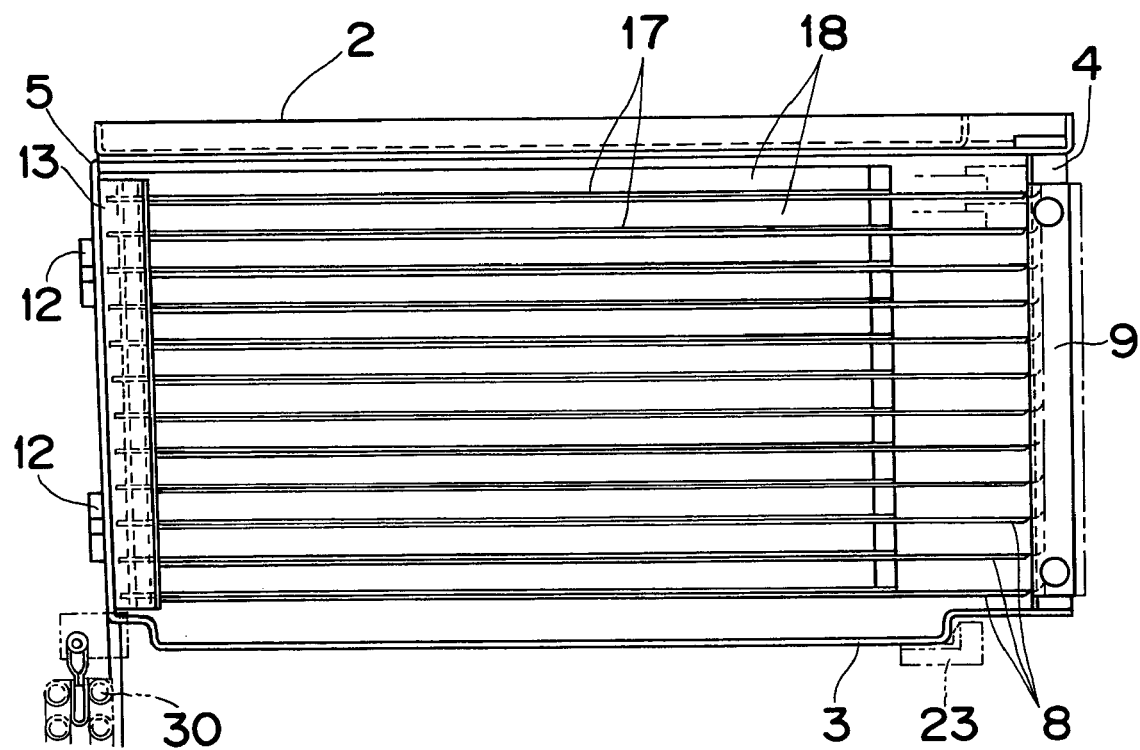
FIG. 4 is a B side view of FIG. 3.
Figure 5:
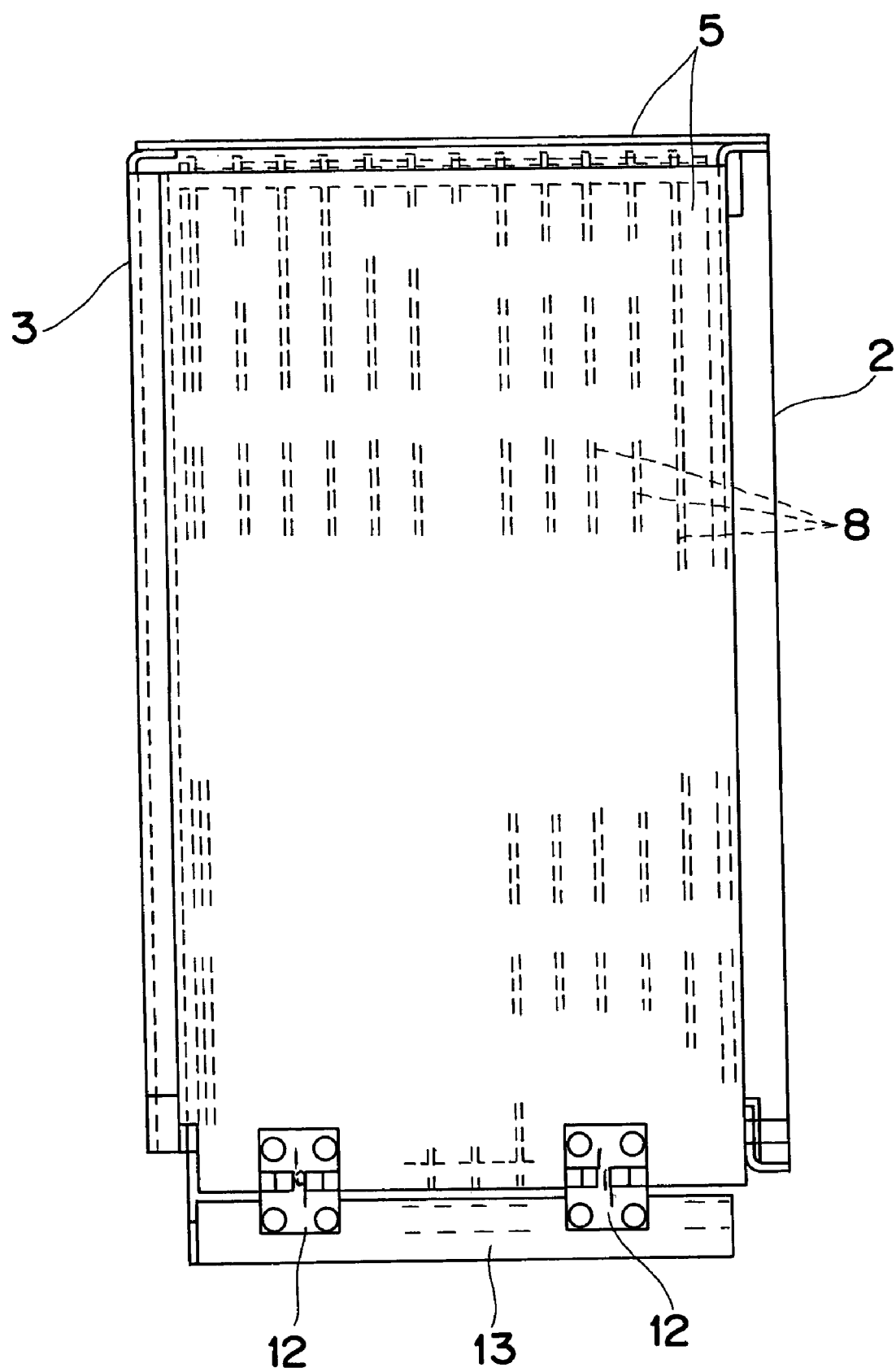
FIG. 5 is a C side view of FIG. 3.
Figure 6:
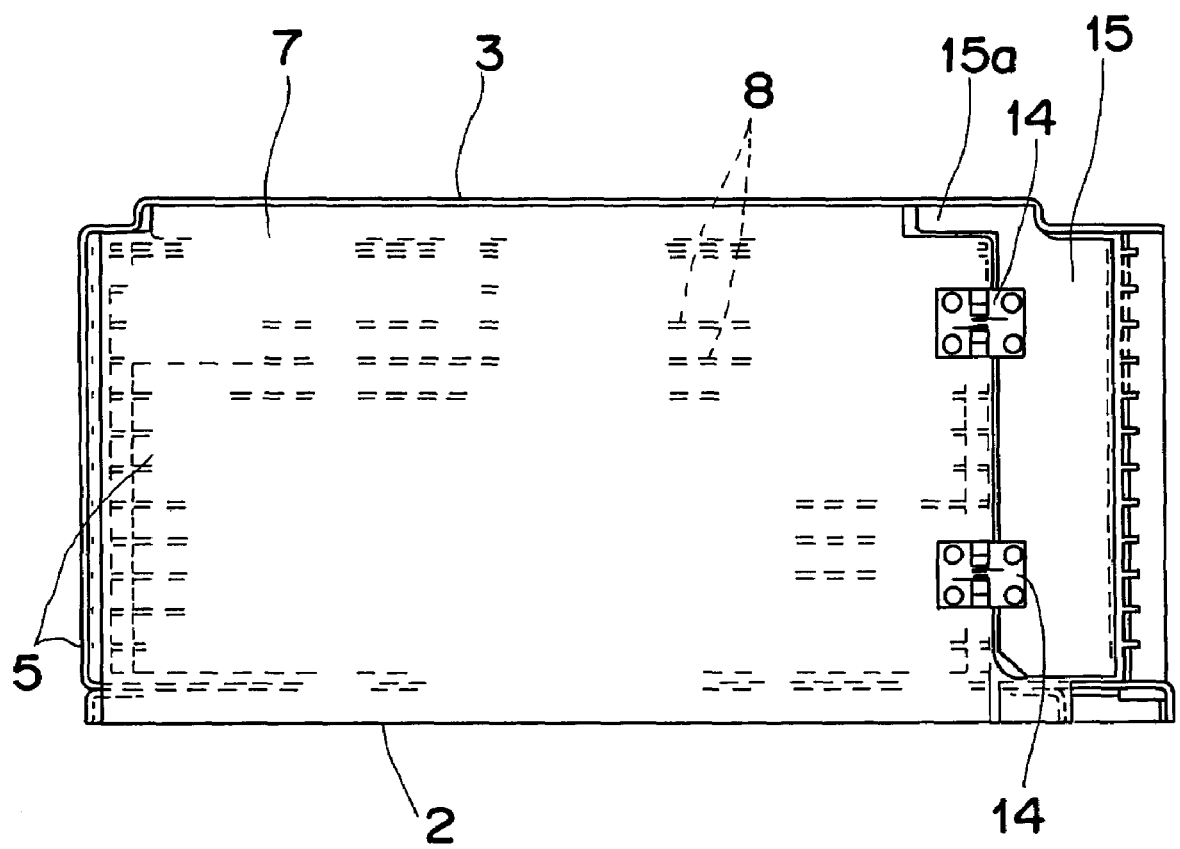
FIG. 6 is a D side view of FIG. 3.

FIG. 1 is a perspective view showing a magazine according to a first aspect of the present invention. FIG. 2 is a view of FIG. 1 seen from an arrow A direction. FIG. 3 is a plan view of FIG. 1 seen from a top of the magazine. FIG. 4 is a B side view of FIG. 3. FIG. 5 is a C side view of FIG. 3. FIG. 6 is a D side view of FIG. 3.

In the drawings, a magazine 1 is a hexahedron composed of a top plate 2 and a bottom plate 3 forming a top and bottom, a pillar 4, and two side plates 5 disposed next to each other so as to construct a frame 90 by the pillar 4 and the two side plates 5. Inside each side plate 5, there is fixed a guide 7 provided with a plurality of lateral grooves 6. Groove 6A, same as groove 6 engraved on the guide 7, is given to the pillar 4. In these grooves 6, 6A, a plurality of partition plates 8 are inserted in an arrow j direction, thereby forming a plurality of racks. Insertion and extraction of these partition plates 8 from the grooves 6, 6A are regulated by a regulation plate 9 screwed to the pillar 4.

In each position opposed to the two side plates 5, there are structured an insertion opening portion 10 and an extraction opening portion 11. For the insertion opening portion 10, there is provided an insertion regulation door 13, serving as one example of a tray plate regulation member, on the side plate 5 on a side of the insertion opening portion 10 via spring hinges 12. The insertion regulation door 13 is urged in a direction of closing the insertion opening portion 10 by the spring hinges 12.

Similarly, for the extraction opening portion 11, there is provided an extraction regulation door 15, serving as one example of a tray plate regulation member, on the side plate 5 on a side of the extraction opening portion 11 via spring hinges 14. The extraction regulation door 15 is pressed to a direction of closing the extraction opening portion 11 by the spring hinges 14. Pressing an edge portion 15a of the extraction regulation door 15 releases the extraction regulation door 15.

Description will now be given of operation of the above-structured magazine 1. First, for housing a tray plate 17 that accommodates a tray 18 loaded with components 80 in the magazine 1, the insertion regulation door 13 that closes the insertion opening portion 10 is opened, and the tray plate 17 is slid over the partition plate 8 set inside the magazine 1 and inserted in an arrow j direction.

For extracting the tray plate 17 housed in the magazine 1, the edge portion 15a of the extraction regulation door 15 that closes the extraction opening portion 11 is pressed to open the extraction regulation door 15, by which the tray plate 17 can be extracted in an arrow k direction.

According to the embodiment as described above, the arrow j direction for inserting the tray plate 17 into the magazine 1 can be approximately orthogonal to the arrow k direction for extracting the tray plate 17 from the magazine 1, which makes it possible to decrease a space required for insertion and extraction operations. Therefore, a depth dimension necessary for extraction and insertion may be decreased.

The insertion opening portion 10 and the extraction opening portion 11 are disposed approximately orthogonal to each other. It is understood that although these two opening portions are described as an insertion opening portion and as an extraction opening portion for convenience' sake, each opening portion allows both insertion and extraction operations.

It is also understood that although in the above description, a plurality of racks are provided with use of the side plates 5 and the pillar 4, a total of four pillars may be used, and a regulation plate 9 for adjusting insertion and extraction of the partition plates 8 and the tray plates 7 may be provided in a portion not functioning as a regulation plate opening portion that regulates partition plate 8.

Figure 12:
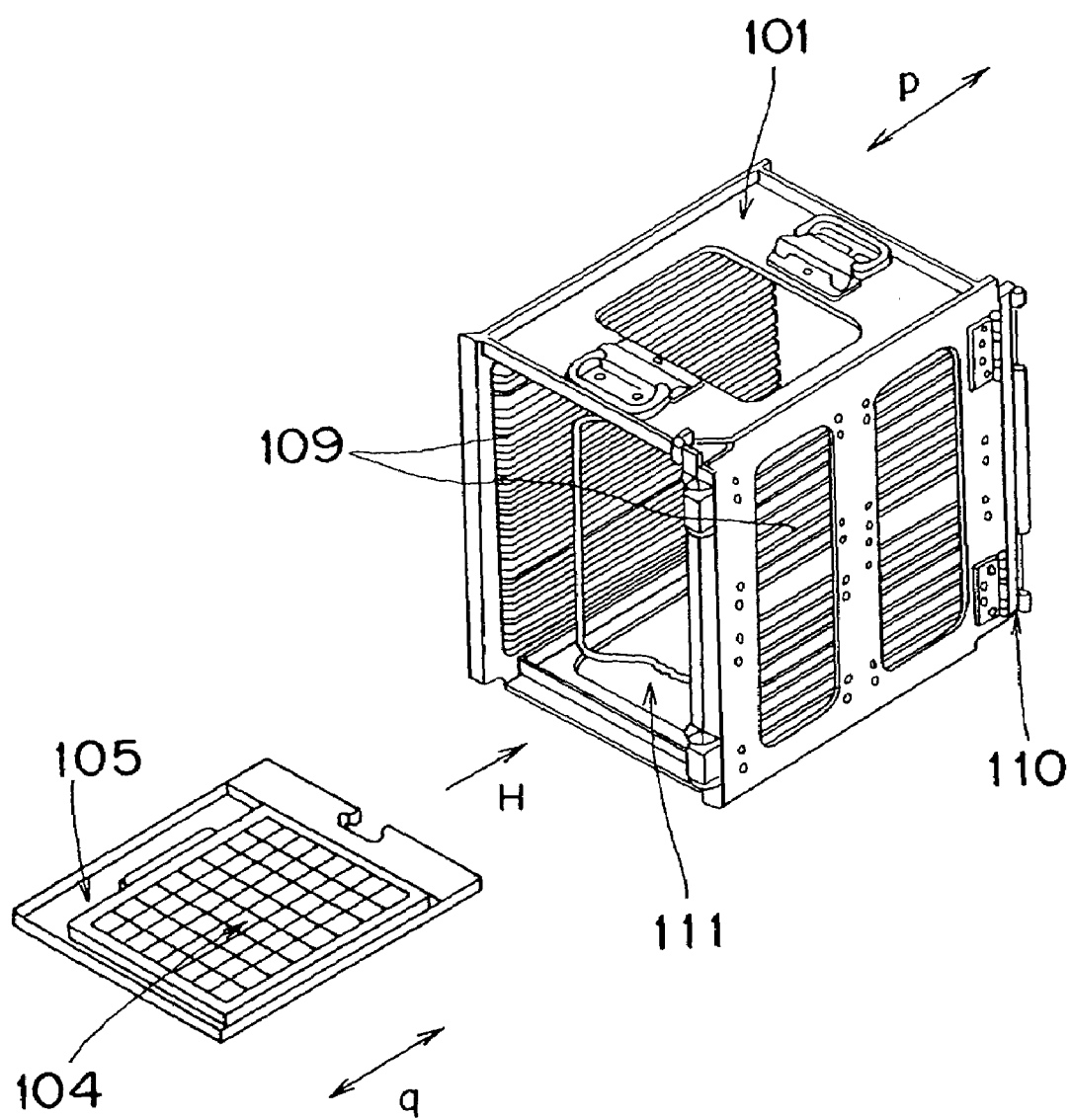
FIG. 12 is a perspective view showing a conventional magazine.
Figure 13:
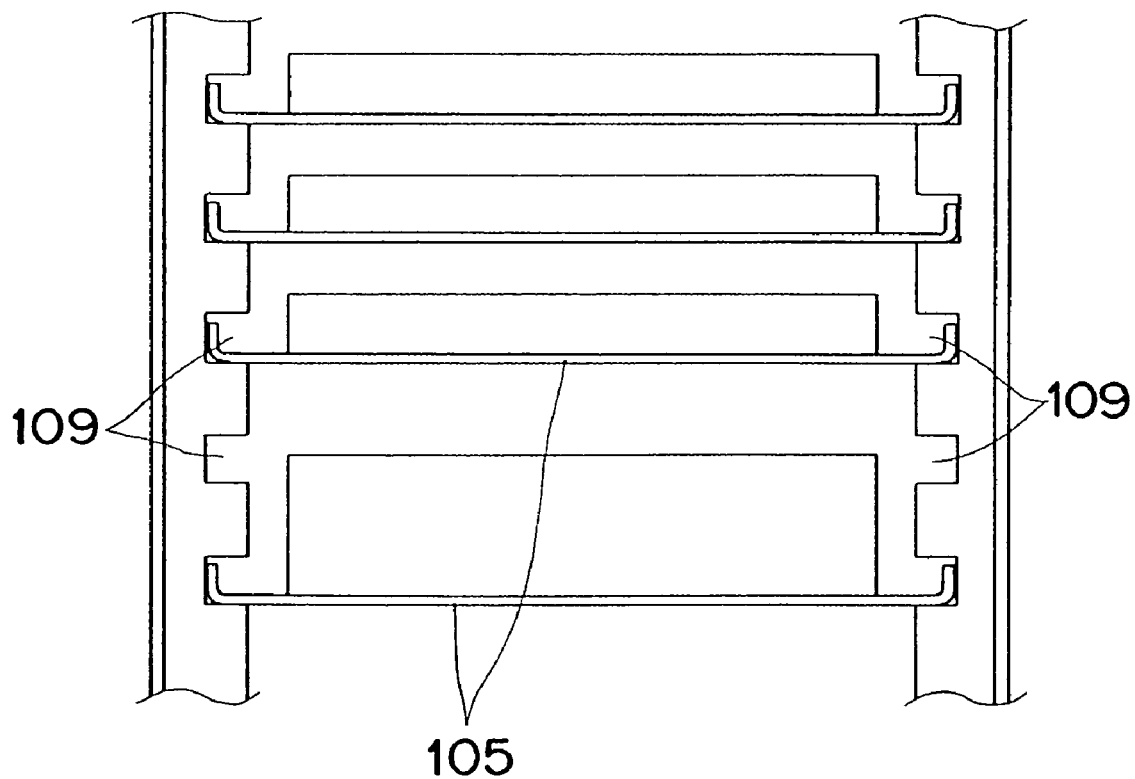
FIG. 13 is a view of FIG. 12 seen from an arrow H direction.
Figure 14:
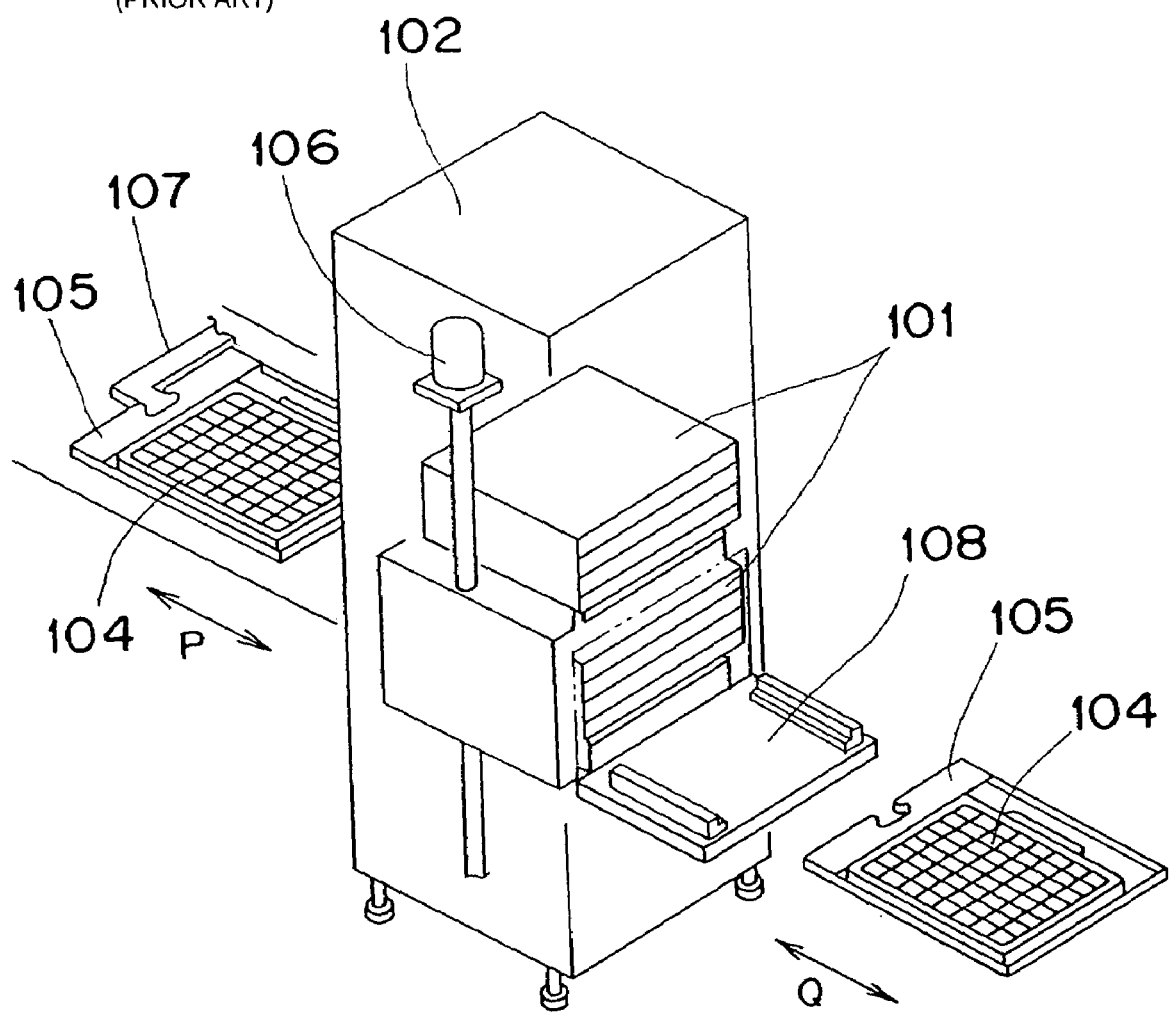
FIG. 14 is a perspective view showing a conventional tray component feeding device.
Figure 15:
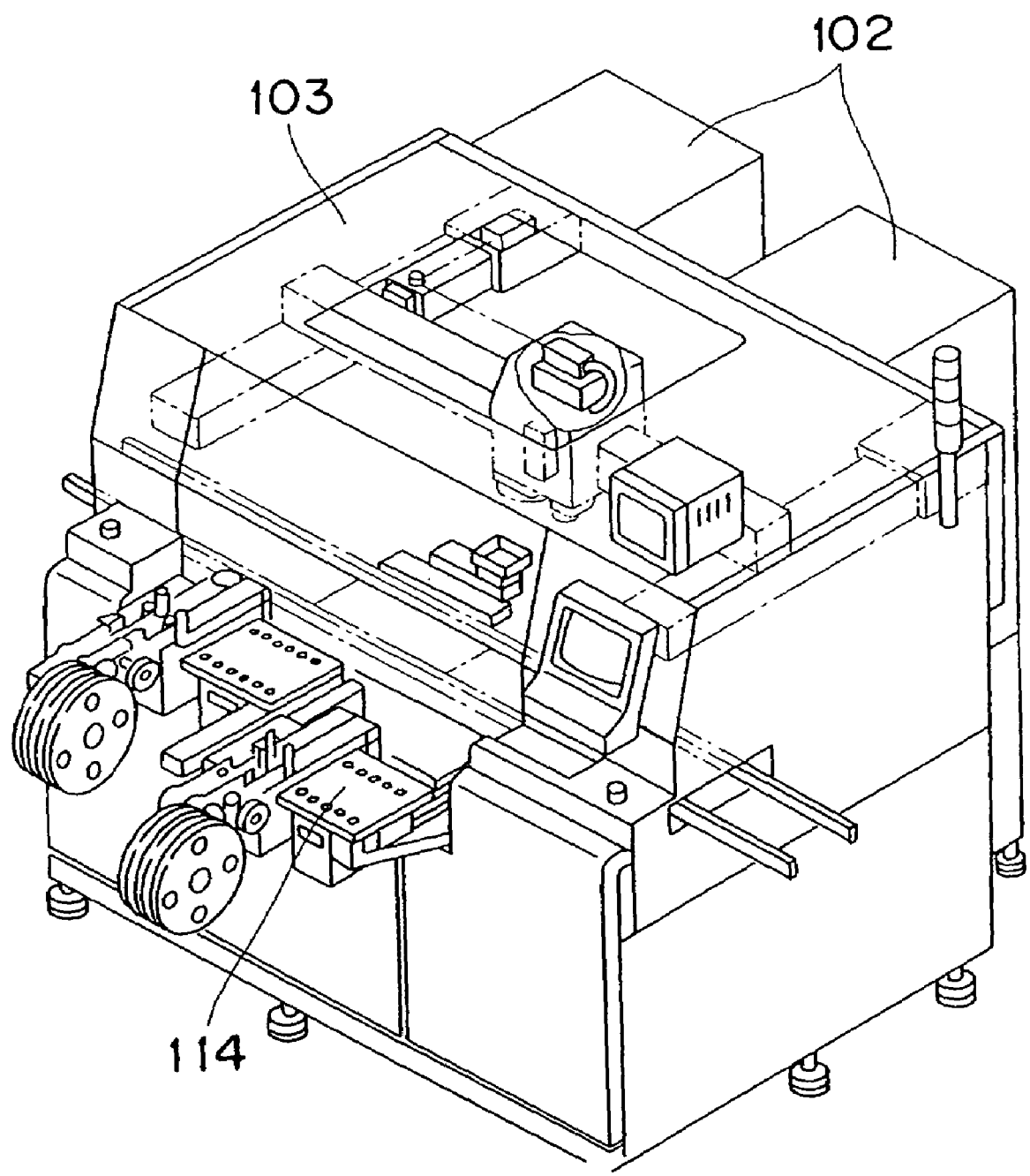
FIG. 15 is a perspective view showing a conventional component mounting device.
Figure 16:
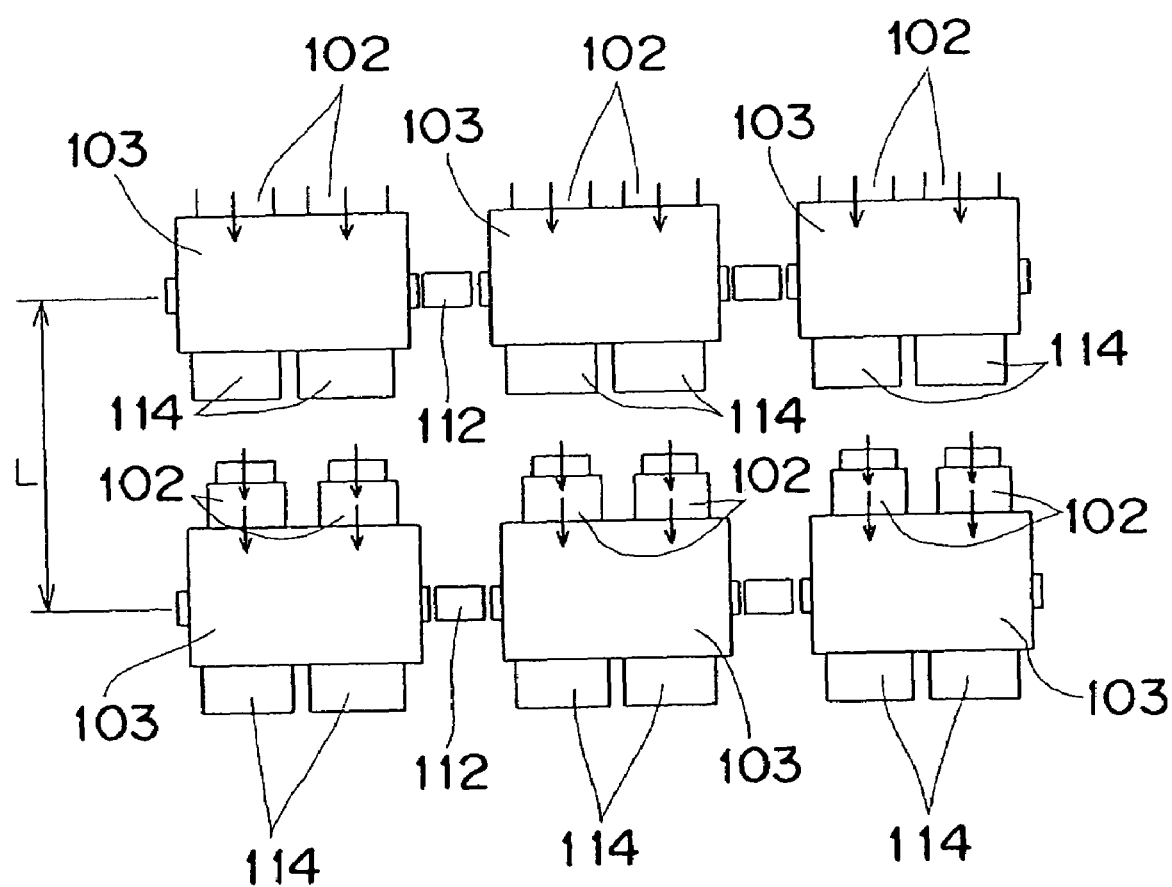
FIG. 16 is a layout drawing showing the component mounting device of FIG. 15 installed as a mounting line.
Figure 17:
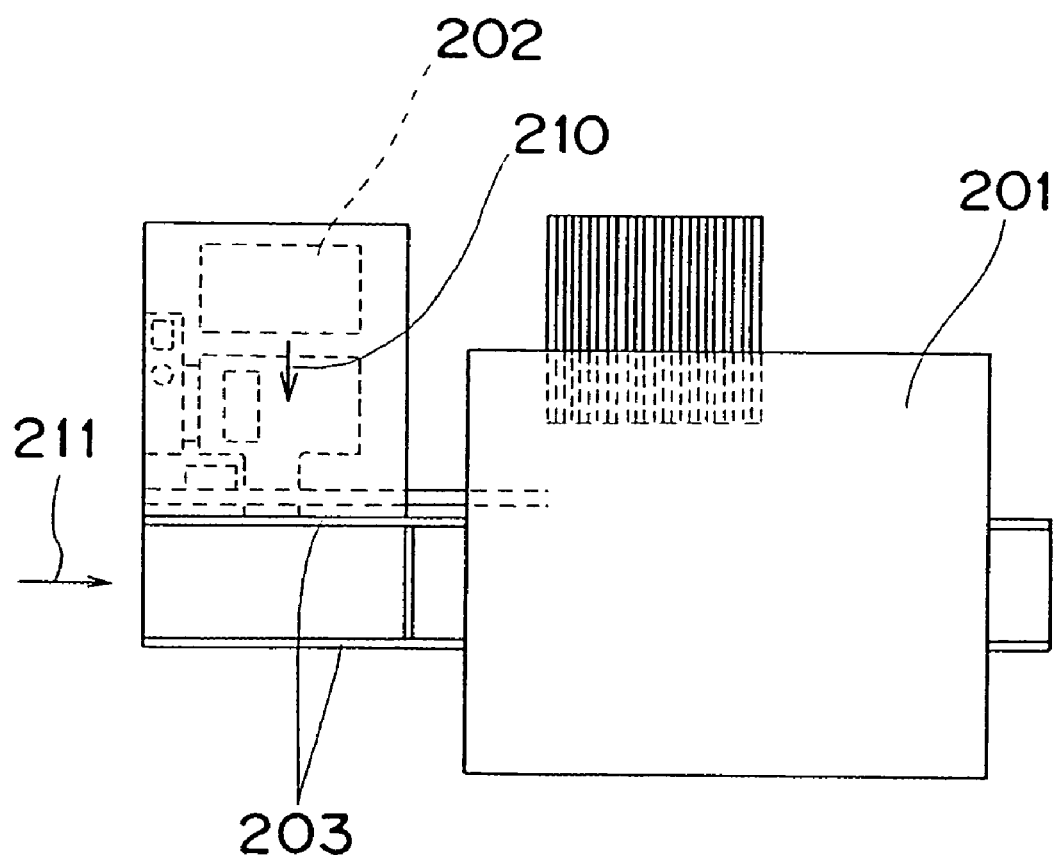
FIG. 17 is a plan view showing another conventional component mounting device.
Figure 18:
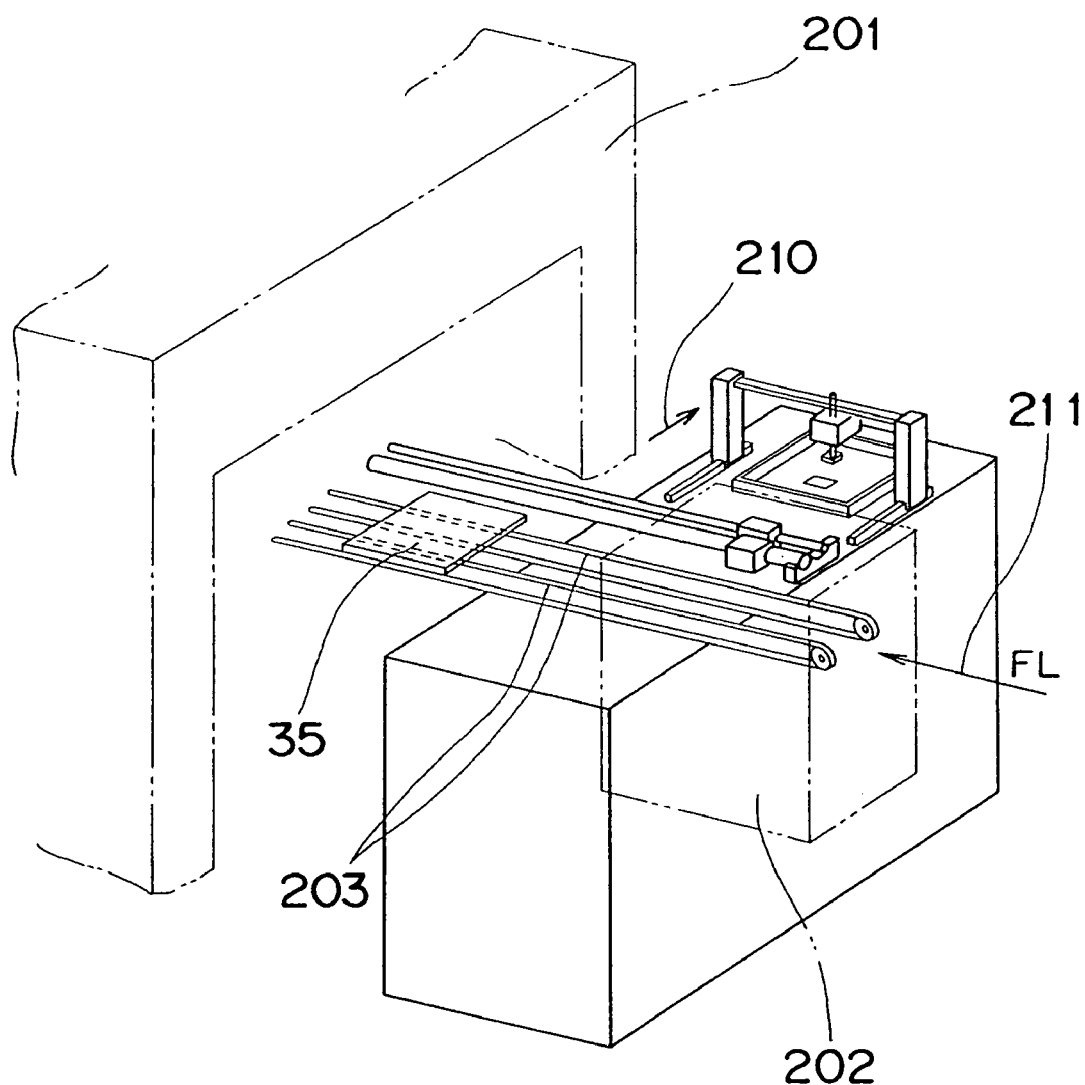
FIG. 18 is a perspective view showing another conventional component mounting device.

It is further understood that all four directions of the magazine may be regarded as opening portions, and a regulation door for adjusting insertion and extraction of the tray plates 17 may be provided for each of them. This makes it possible to insert and extract the tray plates 17 in any of four directions, thereby enabling use of the magazine as the magazine of FIG. 12 shown as prior art.

Furthermore, the top plate 2 and the bottom plate 3 may be placed in a middle of the plurality of racks.

In a case where it is appropriate that a plurality of the racks have constant intervals, the racks may be fixed to the partition plates 8 or the side plates 5.

Although each partition plate 8 may be attached to a plurality of grooves 6, 6A as described before, it is also possible, depending on a thickness of the tray 18 and a component loaded in the tray 18, not to attach the partition plate 8 to a part of the grooves 6, 6A so as to provide racks with broader intervals (see a lowest rack in FIG. 2). More particularly, if a sum total of (a thickness of the tray plate 17), (a thickness of the partition plate 8), and (a thickness of the tray 18 including a component) is smaller than an inter-groove pitch 19, the partition plates 8 may be inserted into all the grooves 6, 6A of the guide 7 and the pillar 4, and the tray plate 17 may be placed on top of them.

If the sum total described above is larger than the inter-groove pitch 19, the partition plates 8 are not inserted into or are removed from the grooves 6, 6A of a corresponding guide 7 and the pillar 4 (see the lowest rack in FIG. 2), so that an insertion space is secured. Each partition plate 8 is removable by removal of the regulation plate 9 as described above.

Next, description will be given of a tray component feeding device in accordance with a second aspect of the present invention with reference to FIG. 7. In this figure, a lifter 22 as one example of an elevation device is constructed by a driving device such as a motor 22A, and a drive shaft such as a threaded shaft 22B driven by the motor 22A and engaged with a lifter stand 23. Thus, by driving the motor 22A to regularly or reversely rotate the shaft 22B, the lifter 22 moves the lifter stand 23 in an up-and-down direction to an arbitrary position.

The lifter stand 23 is composed of two stages, each of which accommodates magazine 1. The lifter stand 23 is equipped with a stopper 28 for regulating a position of a depth of the magazine 1 placed on one of the stages of the lifter stand 23, and a release plate 29 that serves as one example of a release device and brings into contact with and pushes edge portion 15a of extraction regulation door 15 of the magazine 1 for releasing the extraction regulation door 15. On the lifter stand 23, there are provided toggle clamps 30 for fixing plural magazines 1 (see FIG. 4).

An elevating operation of the lifter stand 23 is safely performed with use of a sensor (unshown) that detects closing of an opening and closing door 24 serving as a member for opening and closing a loading port 95. Through an extraction port 25, there may be inserted or extracted an engaging part 26A of an extraction device 26 which serves as one example of a tray plate extraction device and can engage with an engaging portion 27 of tray plate 17, and a tray plate 17 inside the magazine 1 can be extracted. A magazine stand 32 is located beneath the opening and closing door 24, and may receive the magazine 1 as the magazine 1 is inserted or extracted. A direction of passing a tray plate 17 through the loading port 95 and a direction of passing the tray plate 17 through the extraction port 25 are approximately orthogonal to each other, and the loading port 95 and the extraction port 25 are respectively disposed in directions approximately identical to that of the two opening portions 10 and 15 of the magazine 1.

Following description will be given of an operation of the above-structured tray component feeding device 21. The opening and closing door 24 of the tray component feeding device 21 is opened, and the magazine 1 is slid over the magazine stand 32 with the insertion opening portion 10 of the magazine 1 placed in front, and loaded on the lifter stand 23. On the lifter stand 23, the magazine 1 is pushed forward till the magazine 1 reaches the stopper 28, and fixed by the toggle clamp 30 functioning as a fixing device. Consequently, release plate 29 comes into contact with and pushes the edge portion 15a of the extraction regulation door 15, and thus, the extraction regulation door 15 is opened. Insertion and extraction of released tray plate 17 is regulated by guide plates 31 provided in the tray component feeding device. Because the guide plates 31 are not disposed in a portion of the extraction port 25, the tray plate 17 may be inserted and extracted only through the extraction port 25.

Next, after the opening and closing door 24 is closed, and a detection sensor detects this closing, the lifter 22 moves the lifter stand 23 and stops the lifter stand 23 at an appropriate level for extracting a selected tray plate 17.

The engaging part 26A of the extraction device 26 catches the engaging portion 27 of the tray plate 17, and extracts the tray plate 17 through the extraction opening portion 11 of the magazine 1 and through the extraction port 25 of the tray component feeding device 21. Upon completion of component supply, the extraction device 26 returns the tray plate 17 to an interior of the magazine 1 in reverse order of the above.

According to the embodiment as described above, a direction of loading the tray plate 17 and the magazine 1 in the tray component feeding device is made approximately orthogonal to a direction of extracting the tray plate 17 from the magazine 1, thereby enabling implementation of a tray component feeding device with a decreased depth dimension.

Figure 8:
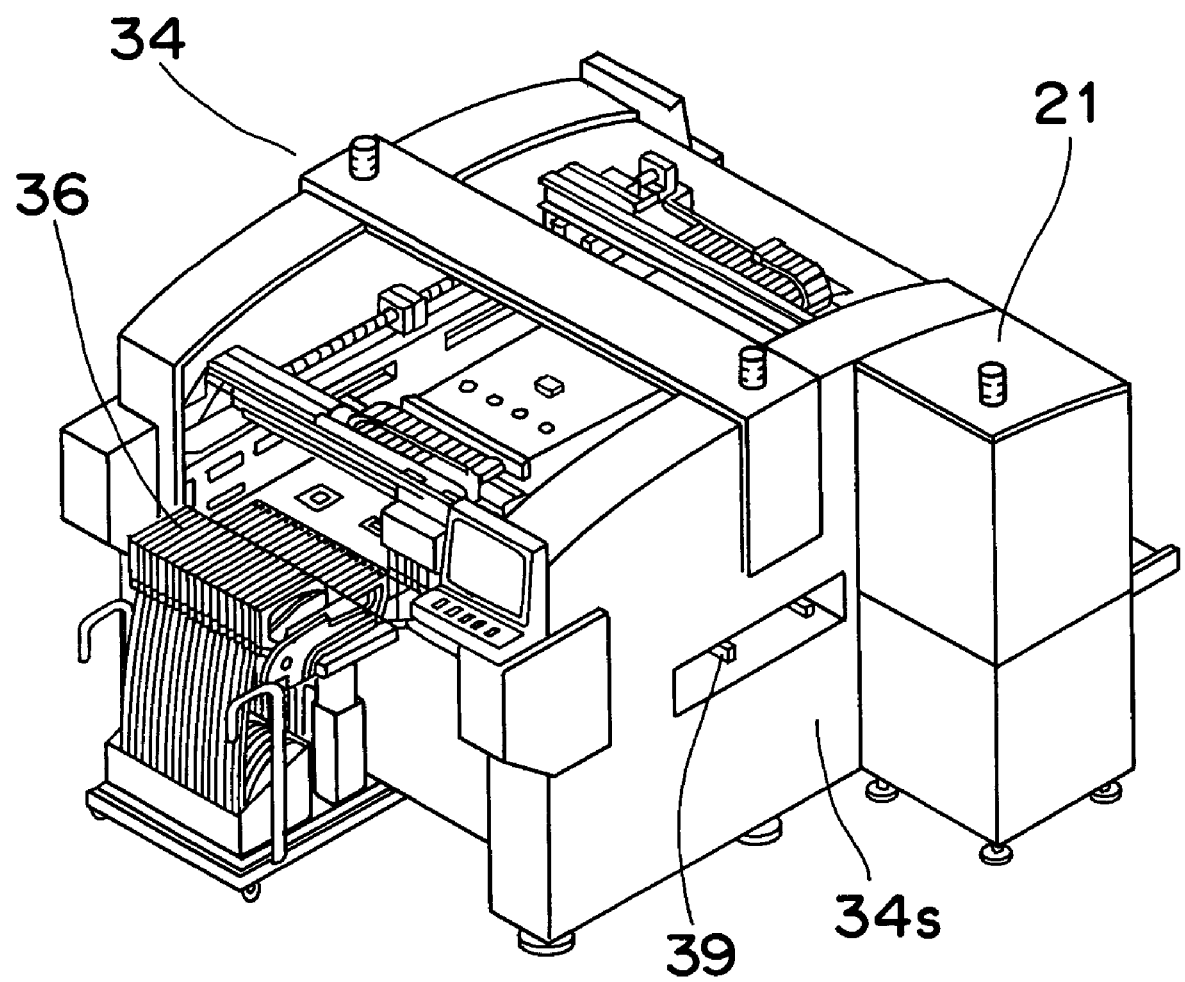
FIG. 8 is a perspective view showing a component mounting device according to a third embodiment of the present invention.
Figure 9:
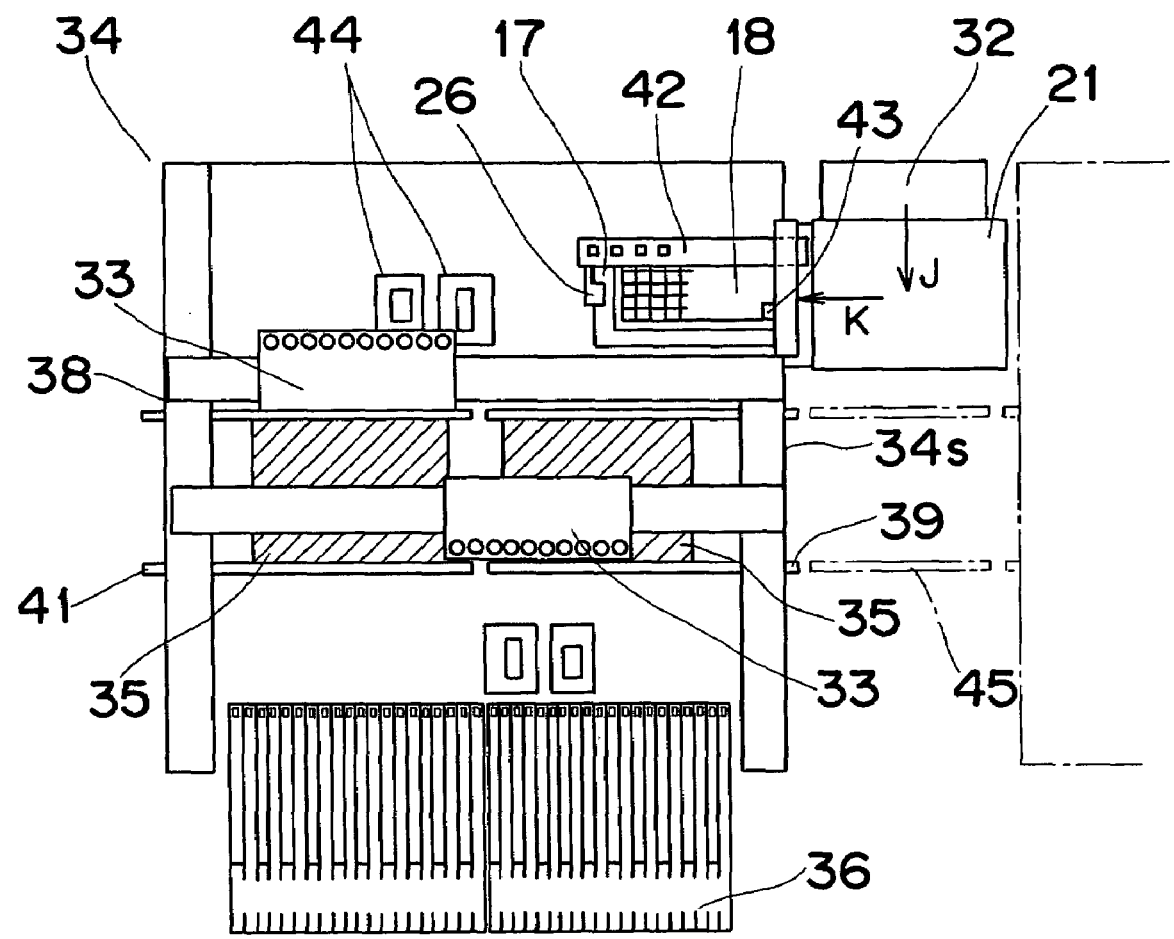
FIG. 9 is a plan view of FIG. 8 seen from a top of the component mounting device.

Further, description will be given of a component mounting device in accordance with a third aspect of the present invention with reference to FIGS. 8 and 9. In these figures, tray component feeding device 21 is disposed on a lateral side 34s of a component mounting device 34. The component mounting device 34 is composed of a loader 39 that is a transfer conveyor for transferring a circuit board 35 to an interior of the component mounting device 34, a tape component feeding device 36 for feeding taped components, an unloader 41 that is a transfer conveyor for transferring a component-mounted circuit board 35 out of the component mounting device 34, a transfer head 43 for placing components on tray plate 17 extracted from the tray component feeding device 21 onto a shuttle conveyor 42, and an XY robot 38 for freely moving a head unit 33 that sucks electric components from the component feeding device 36 or the shuttle conveyor 42 and mounts the components onto a board 35 in an XY plane.

It is noted that suction postures of components held by the head unit 33 are recognized by a component recognizing camera 44 for implementation of posture compensation, by which the components are accurately mounted in specified mounting positions of the board 35.

Operation of the above-structured component mounting device 34 will be described hereinafter. The magazine 1 is loaded into the tray component feeding device 21 in a J direction, that is a direction orthogonal to a board transfer direction of the transfer conveyors 39 and 41, and a tray plate 17 selected from the magazine 1 is extracted through the extraction port 25 of the tray component feeding device 21 in a K direction by the extraction device 26, while the transfer head 43 transfers components on the tray 18 to a top of the shuttle conveyor 42. The tray plate 17 taken into the component mounting device 34 is located along the board transfer direction of the transfer conveyor 39.

The components on the shuttle conveyor 42 are conveyed to an end position of the shuttle conveyor 42, where each of the components is picked up by the head unit 33, and subjected to posture compensation by the component recognizing camera 44. After that, this component is mounted onto the board 35 by the head portion 33. It is also possible to directly pick up, by the head unit 33, a component on the tray 18 not through the shuttle conveyor 42.

Accordingly, in a case where replacement of the tray plate 17 is desired because all the components on the tray plate 17 are no longer fed to the component mounting device 34, the components need replacement with other components, or because of other reasons, the tray plate 17 taken into the component mounting device 34 is returned to the interior of the magazine 1, and a new tray plate 17 is extracted therefrom. The tray plate 17 may be inserted or extracted into/from the magazine 1 in a state that the magazine 1 is loaded onto the lifter stand 23.

According to the embodiment as described above, the tray component feeding device may be disposed with a decreased depth dimension of the component mounting device, thereby enabling implementation of a component mounting device with good area productivity.

Figure 10:
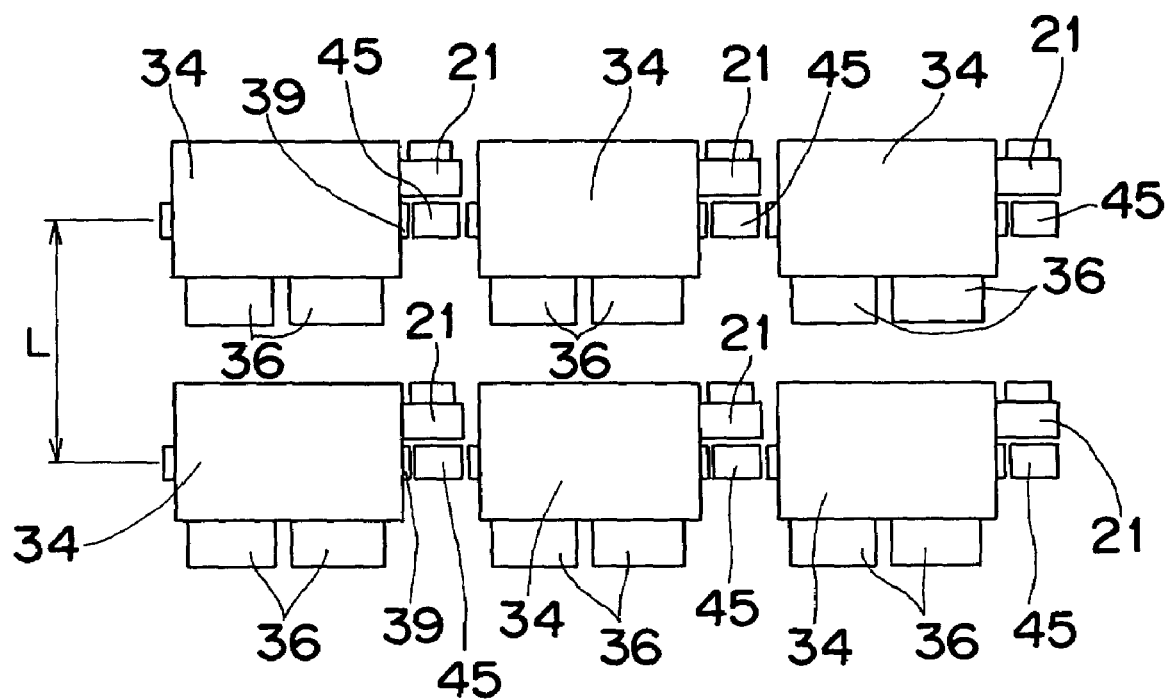
FIG. 10 is a layout drawing showing the component mounting device of FIG. 9 installed as a mounting line.

Accordingly, in structuring a component mounting line including the component mounting device as shown in FIG. 10, an installation pitch L between the line and other adjacent component mounting lines can be decreased.

Figure 7:
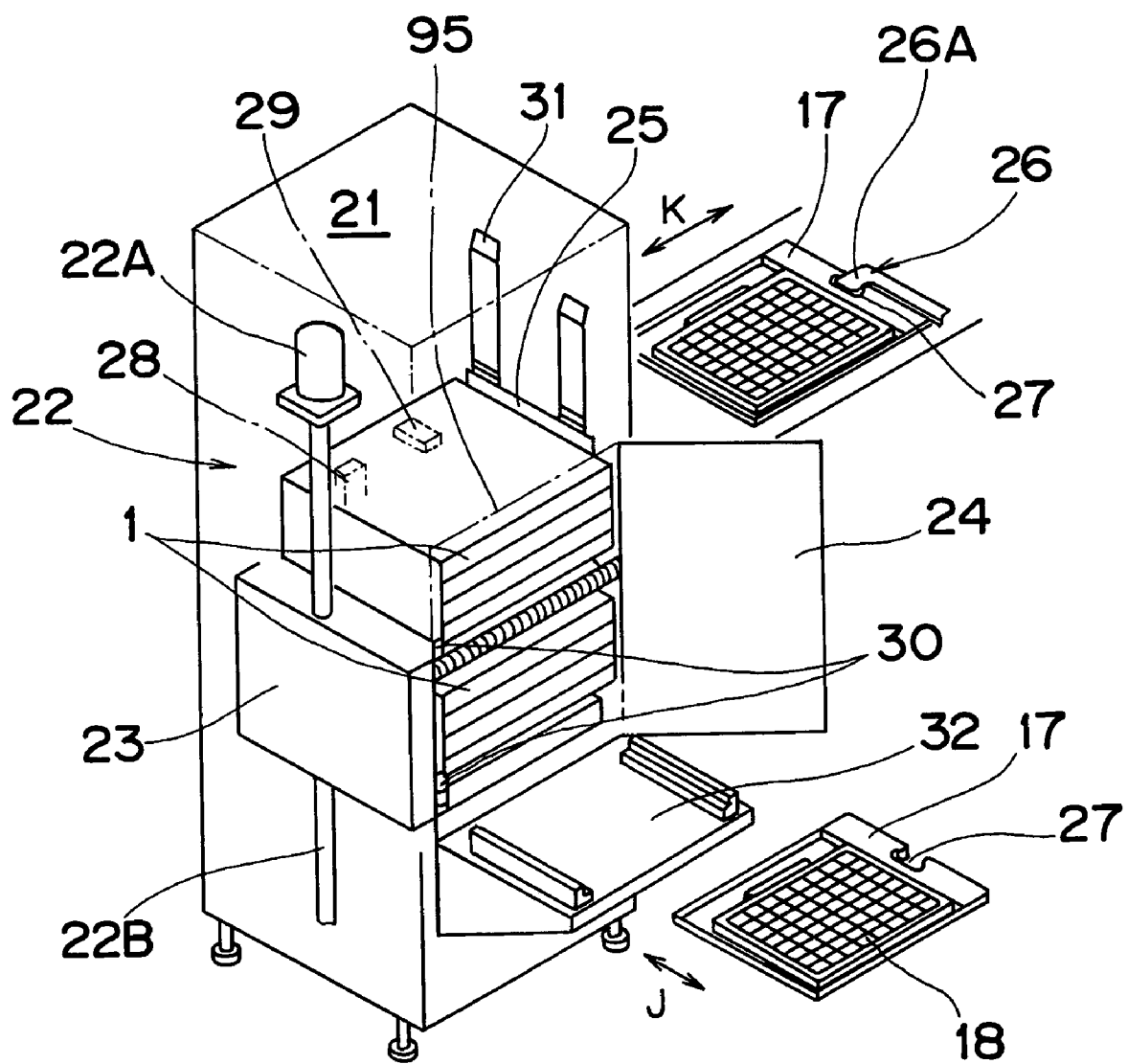
FIG. 7 is a perspective view showing a tray component feeding device according to a second embodiment of the present invention.

Although in the above description, the tray component feeding device is disposed on the right lateral side of the component mounting device, providing the tray component feeding device symmetric to the tray component feeding device of FIG. 7 makes it possible to dispose the tray component feeding device on the left lateral side of the component mounting device.

Figure 11:
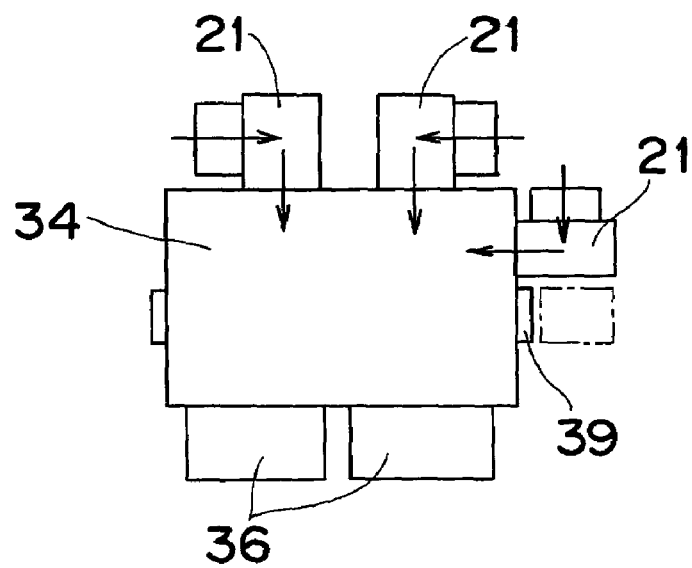
FIG. 11 is a plan view showing the component mounting device of FIG. 9 in another embodiment.

Furthermore, the tray component feeding device may be disposed at a rear end of the component mounting device as shown in FIG. 11. In such structure, a direction of inserting and extracting a magazine into/from the tray component feeding device is parallel to a board transfer direction of the circuit board transfer conveyor, thereby enabling a decreased depth dimension of the component mounting device.

As described above, the magazine according to the present invention is provided with two opening portions that enable insertion and extraction of a tray and are approximately orthogonal to each other, and a regulation member for regulating insertion and extraction of the tray from the opening portions, thereby implementing an effect of decreasing a depth dimension necessary for insertion and extraction of the tray into/from the magazine.

Furthermore, the tray component feeding device according to the present invention has a loading port for loading a magazine and an extraction port for extracting a tray plate of the magazine, which are approximately orthogonal to each other, thereby providing an effect of implementing the tray component feeding device with a decreased depth dimension.

In addition, the component mounting device according to the present invention is provided with a tray component feeding device loaded with a magazine on a lateral side of the component mounting device to which a transfer conveyor for transferring a circuit board extends, thereby providing an effect of implementing the component mounting device with good area productivity.

Although the present invention has been fully described in connection with preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A tray component feeding device in combination with a magazine for housing a tray plate,
said magazine comprising:
   (i) a frame having a first opening for allowing the tray plate to be passed therethrough so as to be inserted within said magazine, and also having a second opening for allowing the tray plate to be passed therethrough so as to be removed from said magazine, wherein said first opening and said second opening are on respective lateral sides of said frame, with said respective lateral sides being approximately orthogonal to one another; and
   (ii) a regulation door on said frame operable to open and close one of said first opening and said second opening so as to allow the tray plate to pass through said one of first opening and said second opening when said regulation door opens said one of said first opening and said second opening, and so as to prevent the tray plate from passing through said one of said first opening and said second opening when said regulation door closes said one of said first opening and said second opening,
said tray component feeding device comprising:
   (i) a loading port and an extraction port, wherein said loading port and said extraction port are on respective lateral sides of said tray component feeding device, with said respective lateral sides being approximately orthogonal to one another;
   (ii) an elevation device for moving said magazine in an up and down direction after said magazine has been inserted into said tray component feeding device via said loading port, and for thereby moving the tray plate in an up and down direction to an extraction level when the tray plate is within said magazine; and
   (iii) a tray plate extraction device for extracting, through said second opening and then through said extraction port, the tray plate after having been moved to the extraction level by said elevation device,
wherein when said magazine is within said tray component feeding device, said first opening and said loading port face in approximately the same direction, and said second opening and said extraction port face in approximately the same direction.

2. The tray component feeding device in combination with a magazine according to claim 1, wherein
said regulation door is a first regulation door, and
said magazine further comprises a second regulation door on said frame operable to open and close the other of said first opening and said second opening so as to allow the tray plate to pass through said other of said first opening and said second opening when said second regulation door opens said other of said first opening and said second opening, and so as to prevent the tray plate from passing through said other of said first opening and said second opening when said second regulation door closes said one of said first opening and said second opening.

3. The tray component feeding device in combination with a magazine according to claim 2, wherein
planes defined by said respective lateral sides of said magazine intersect one another to define a line,
said frame further has
   (i) a pillar having grooves spaced at constant intervals on a lateral side of said pillar, with said line extending through said pillar, and
   (ii) a side plate having grooves spaced at the constant intervals, and
said magazine further comprises a rack positioned in one of said grooves of said pillar and one of said grooves of said side plate.

4. The tray component feeding device in combination with a magazine according to claim 3, wherein
said tray component feeding device further comprises a release device for releasing said regulation door, after said magazine has been inserted into said tray component feeding device via said loading port, to thereby allow said regulation door to open said one of said first opening and said second opening.

5. The tray component feeding device in combination with a magazine according to claim 4, wherein
said regulation door is operable to open and close said second opening, such that said tray plate extraction device is for extracting the tray plate, after having been moved to the extraction level by said elevation device, through said second opening and then through said extraction port after said second opening has been opened by said regulation door in response to said regulation door having been released by said release device.

6. The tray component feeding device in combination with a magazine according to claim 2, wherein
said tray component feeding device further comprises a release device for releasing said first regulation door, after said magazine has been inserted into said tray component feeding device via said loading port, to thereby allow said first regulation door to open said one of said first opening and said second opening.

7. The tray component feeding device in combination with a magazine according to claim 1, wherein
planes defined by said respective lateral sides of said magazine intersect one another to define a line,
said frame further has
(i) a pillar having grooves spaced at constant intervals on a lateral side of said pillar, with said line extending through said pillar, and
(ii) a side plate having grooves spaced at the constant intervals, and
said magazine further comprises a rack positioned in one of said grooves of said pillar and one of said grooves of said side plate.

8. The tray component feeding device in combination with a magazine according to claim 1, wherein
said tray component feeding device further comprises a release device for releasing said regulation door, after said magazine has been inserted into said tray component feeding device via said loading port, to thereby allow said regulation door to open said one of said first opening and said second opening.

9. A component mounting system comprising:
a magazine for housing a tray plate, said magazine including
(i) a frame having a first opening for allowing the tray plate to be passed therethrough so as to be inserted within said magazine, and also having a second opening for allowing the tray plate to be passed therethrough so as to be removed from said magazine, wherein said first opening and said second opening are on respective lateral sides of said frame, with said respective lateral sides being approximately orthogonal to one another, and
(ii) a regulation door on said frame operable to open and close one of said first opening and said second opening so as to allow the tray plate to pass through said one of first opening and said second opening when said regulation door opens said one of said first opening and said second opening, and so as to prevent the tray plate from passing through said one of said first opening and said second opening when said regulation door closes said one of said first opening and said second opening;
a tray component feeding device including
(i) a loading port and an extraction port, wherein said loading port and said extraction port are on respective lateral sides of said tray component feeding device, with said respective lateral sides being approximately orthogonal to one another,
(ii) an elevation device for moving said magazine in an up and down direction after said magazine has been inserted into said tray component feeding device via said loading port, and for thereby moving the tray plate in an up and down direction to an extraction level when the tray plate is within said magazine, and
(iii) a tray plate extraction device for extracting, through said second opening and then through said extraction port, the tray plate after having been moved to the extraction level by said elevation device;
a transfer conveyor for transferring a board in a board transfer direction; and
a head unit for picking up a component from the tray plate after having been extracted through said second opening and said extraction port, and then mounting the component onto the board after having been transferred by said transfer conveyor,
wherein when said magazine is within said tray component feeding device, said first opening and said loading port face in approximately the same direction, and said second opening and said extraction port face in approximately the same direction, and
wherein said tray component feeding device is positioned relative to said transfer conveyor such that a direction of passing the tray plate through said second opening and said extraction port is approximately parallel to the board transfer direction, and a direction of passing said magazine through said loading port is approximately orthogonal to the board transfer direction.

10. The component mounting system according to claim 9, wherein
said regulation door is a first regulation door, and
said magazine further comprises a second regulation door on said frame operable to open and close the other of said first opening and said second opening so as to allow the tray plate to pass through said other of said first opening and said second opening when said second regulation door opens said other of said first opening and said second opening, and so as to prevent the tray plate from passing through said other of said first opening and said second opening when said second regulation door closes said one of said first opening and said second opening.

11. The component mounting system according to claim 10, wherein
planes defined by said respective lateral sides of said magazine intersect one another to define a line,
said frame further has
(i) a pillar having grooves spaced at constant intervals on a lateral side of said pillar, with said line extending through said pillar, and
(ii) a side plate having grooves spaced at the constant intervals, and
said magazine further comprises a rack positioned in one of said grooves of said pillar and one of said grooves of said side plate.

12. The component mounting system according to claim 11, wherein
said tray component feeding device further comprises a release device for releasing said regulation door, after said magazine has been inserted into said tray component feeding device via said loading port, to thereby allow said regulation door to open said one of said first opening and said second opening.

13. The component mounting system according to claim 12, wherein
said regulation door is operable to open and close said second opening, such that said tray plate extraction device is for extracting the tray plate, after having been moved to the extraction level by said elevation device, through said second opening and then through said extraction port after said second opening has been opened by said regulation door in response to said regulation door having been released by said release device.

14. The component mounting system according to claim 10, wherein
said tray component feeding device further comprises a release device for releasing said first regulation door, after said magazine has been inserted into said tray component feeding device via said loading port, to thereby allow said first regulation door to open said one of said first opening and said second opening.

15. The component mounting system according to claim 9, wherein
  planes defined by said respective lateral sides of said magazine intersect one another to define a line,
  said frame further has
    (i) a pillar having grooves spaced at constant intervals on a lateral side of said pillar, with said line extending through said pillar, and
    (ii) a side plate having grooves spaced at the constant intervals, and
  said magazine further comprises a rack positioned in one of said grooves of said pillar and one of said grooves of said side plate.

16. The component mounting system according to claim 9, wherein
  said tray component feeding device further comprises a release device for releasing said regulation door, after said magazine has been inserted into said tray component feeding device via said loading port, to thereby allow said regulation door to open said one of said first opening and said second opening.

17. A tray component feeding device for loading a magazine for housing a tray plate,
  the magazine comprising:
    (i) a frame having a first opening for allowing the tray plate to be passed therethrough so as to be inserted within the magazine, and also having a second opening for allowing the tray plate to be passed therethrough so as to be removed from the magazine, wherein the first opening and the second opening are on respective lateral sides of the frame, with the respective lateral sides being approximately orthogonal to one another; and
    (ii) a regulation door on the frame operable to open and close one of the first opening and the second opening so as to allow the tray plate to pass through the one of first opening and the second opening when the regulation door opens the one of the first opening and the second opening, and so as to prevent the tray plate from passing through the one of the first opening and the second opening when the regulation door closes the one of the first opening and the second opening,
  said tray component feeding device comprising:
    (i) a loading port and an extraction port, wherein said loading port and said extraction port are on respective lateral sides of said tray component feeding device, with said respective lateral sides being approximately orthogonal to one another;
    (ii) an elevation device for moving the magazine in an up and down direction after the magazine has been inserted into said tray component feeding device via said loading port, and for thereby moving the tray plate in an up and down direction to an extraction level when the tray plate is within the magazine; and
    (iii) a tray plate extraction device for extracting, through said second opening and then through said extraction port, the tray plate after having been moved to the extraction level by said elevation device,
  wherein when the magazine is within said tray component feeding device, the first opening and said loading port face in approximately the same direction, and the second opening and said extraction port face in approximately the same direction.

18. The tray component feeding device according to claim 17, wherein
  the regulation door is a first regulation door, and
  the magazine further comprises a second regulation door on the frame operable to open and close the other of the first opening and the second opening so as to allow the tray plate to pass through the other of the first opening and the second opening when the second regulation door opens the other of the said first opening and the second opening, and so as to prevent the tray plate from passing through said other of the first opening and the second opening when the second regulation door closes the one of the first opening and the second opening.

19. The tray component feeding device according to claim 18, wherein
  planes defined by the respective lateral sides of the magazine intersect one another to define a line,
  the frame further has
    (i) a pillar having grooves spaced at constant intervals on a lateral side of the pillar, with said line extending through the pillar, and
    (ii) a side plate having grooves spaced at the constant intervals, and
  the magazine further comprises a rack positioned in one of the grooves of the pillar and one of the grooves of the side plate.

20. The tray component feeding device according to claim 19, wherein
  said tray component feeding device further comprises a release device for releasing the regulation door, after the magazine has been inserted into said tray component feeding device via said loading port, to thereby allow the regulation door to open the one of the first opening and the second opening.

21. The tray component feeding device according to claim 20, wherein
  the regulation door is operable to open and close the second opening, such that said tray plate extraction device is for extracting the tray plate, after having been moved to the extraction level by said elevation device, through the second opening and then through said extraction port after the second opening has been opened by the regulation door in response to the regulation door having been released by said release device.

22. The tray component feeding device according to claim 18, wherein
  said tray component feeding device further comprises a release device for releasing the first regulation door, after the magazine has been inserted into said tray component feeding device via said loading port, to thereby allow the first regulation door to open the one of the first opening and the second opening.

23. The tray component feeding device according to claim 17, wherein
  planes defined by the respective lateral sides of the magazine intersect one another to define a line,
  the frame further has
    (i) a pillar having grooves spaced at constant intervals on a lateral side of the pillar, with said line extending through the pillar, and
    (ii) a side plate having grooves spaced at the constant intervals, and the magazine further comprises a rack positioned in one of the grooves of the pillar and one of the grooves of the side plate.

24. The tray component feeding device according to claim 17, wherein
said tray component feeding device further comprises a release device for releasing the regulation door, after the magazine has been inserted into said tray component feeding device via said loading port, to thereby allow the regulation door to open the one of the first opening and the second opening.

* * * * *